United States Patent
Rigano et al.

(10) Patent No.: US 10,141,508 B2
(45) Date of Patent: Nov. 27, 2018

(54) CLAMP ELEMENTS FOR PHASE CHANGE MEMORY ARRAYS

(71) Applicant: Micron Technology, Inc., Boise, ID (US)

(72) Inventors: Antonino Rigano, Pioltello (IT); Fabio Pellizzer, Cornate d'Adda (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/347,271

(22) Filed: Nov. 9, 2016

(65) Prior Publication Data

US 2017/0062715 A1  Mar. 2, 2017

Related U.S. Application Data

(62) Division of application No. 13/783,884, filed on Mar. 4, 2013, now Pat. No. 9,520,554.

(51) Int. Cl.
| | |
|---|---|
| *H01L 45/00* | (2006.01) |
| *G11C 13/00* | (2006.01) |
| *H01L 27/24* | (2006.01) |

(52) U.S. Cl.
CPC ...... *H01L 45/1691* (2013.01); *G11C 13/0004* (2013.01); *G11C 13/0023* (2013.01); *G11C 13/0038* (2013.01); *H01L 27/2445* (2013.01); *H01L 27/2463* (2013.01); *H01L 45/06* (2013.01); *H01L 45/065* (2013.01); *H01L 45/12* (2013.01); *H01L 45/124* (2013.01); *H01L 45/128* (2013.01); *H01L 45/143* (2013.01); *H01L 45/144* (2013.01); *H01L 45/16* (2013.01)

(58) Field of Classification Search
None
See application file for complete search history.

(56) References Cited

U.S. PATENT DOCUMENTS

| | | |
|---|---|---|
| 6,791,107 B2 | 9/2004 | Gill et al. |
| 7,257,039 B2 | 8/2007 | Bedeschi et al. |
| 7,446,011 B2 | 11/2008 | Pellizzer et al. |
| 7,570,524 B2 | 8/2009 | Bedeschi et al. |
| 7,750,524 B2 | 7/2010 | Bedeschi et al. |
| 7,929,339 B2 | 4/2011 | Kang et al. |
| 7,986,549 B1 | 7/2011 | Tang et al. |
| 8,045,368 B2 | 10/2011 | Em |
| 8,243,497 B1 * | 8/2012 | Pellizzer .......... G11C 8/14 365/100 |
| 8,351,246 B2 | 1/2013 | Porter |
| 9,520,554 B2 | 12/2016 | Rigano et al. |

(Continued)

OTHER PUBLICATIONS

Pellizzer et al. "Phase-Change Memories for Non-Scale Technology and Design", Micron, Process R&D, pp. all.

(Continued)

*Primary Examiner* — Long Pham
(74) *Attorney, Agent, or Firm* — Dorsey & Whitney LLP

(57) ABSTRACT

Clamp elements, memories, apparatuses, and methods for forming the same are disclosed herein. An example memory may include an array of memory cells and a plurality of clamp elements. A clamp element of the plurality of clamp elements may include a cell structure formed non-orthogonally relative to at least one of a bit line or a word line of the array of memory cells and may be configured to control a voltage of a respective bit line.

9 Claims, 18 Drawing Sheets

(56) References Cited

U.S. PATENT DOCUMENTS

| 9,525,007 B2 | 12/2016 | Pellizzer et al. |
| 2005/0117388 A1 | 6/2005 | Cho et al. |
| 2005/0265072 A1* | 12/2005 | Hart .................. G11C 13/0004 |
| | | 365/163 |
| 2008/0144347 A1 | 6/2008 | Takemura et al. |
| 2008/0232160 A1 | 9/2008 | Gopalakrishnan |
| 2008/0303016 A1 | 12/2008 | Cho et al. |
| 2012/0009758 A1* | 1/2012 | Chang ................. H01L 27/2463 |
| | | 438/382 |
| 2012/0161096 A1 | 6/2012 | Pellizzer |
| 2014/0247654 A1 | 9/2014 | Rigano et al. |
| 2017/0092696 A1 | 3/2017 | Pellizzer et al. |

OTHER PUBLICATIONS

Servalli "A 45nm Generation Phase Change Memory Technology", Numonyx—R&D Technology Development, pp. all.

U.S. Appl. No. 15/858,728, entitled 'Clamp Elements for Phase Change Memory Arrays', filed Dec. 29, 2017.

\* cited by examiner

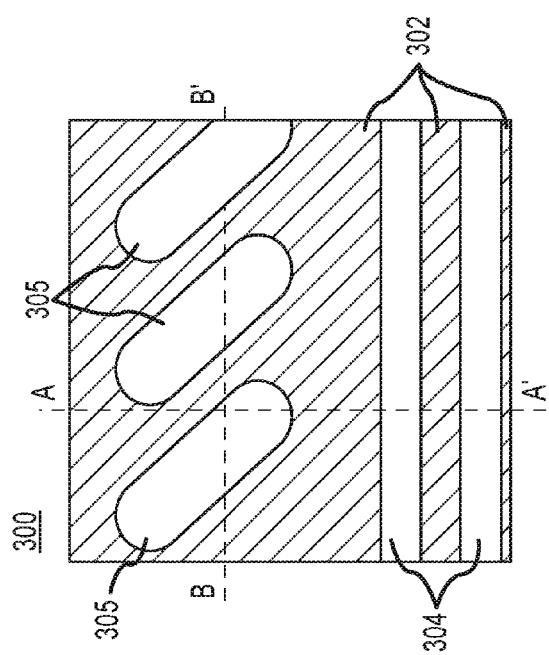
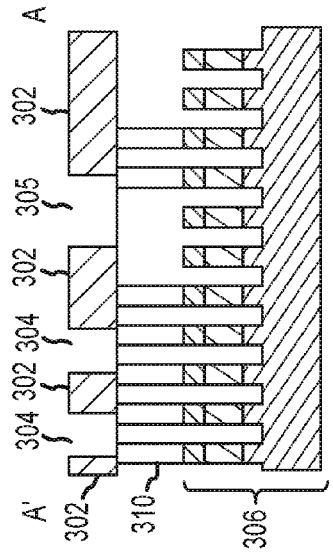
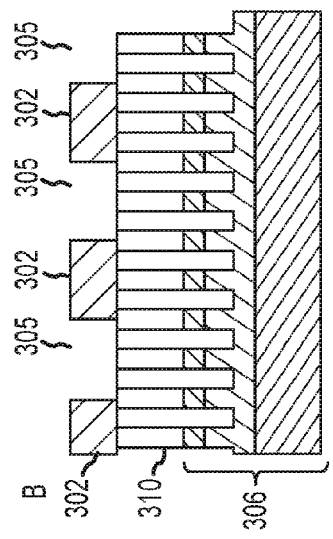

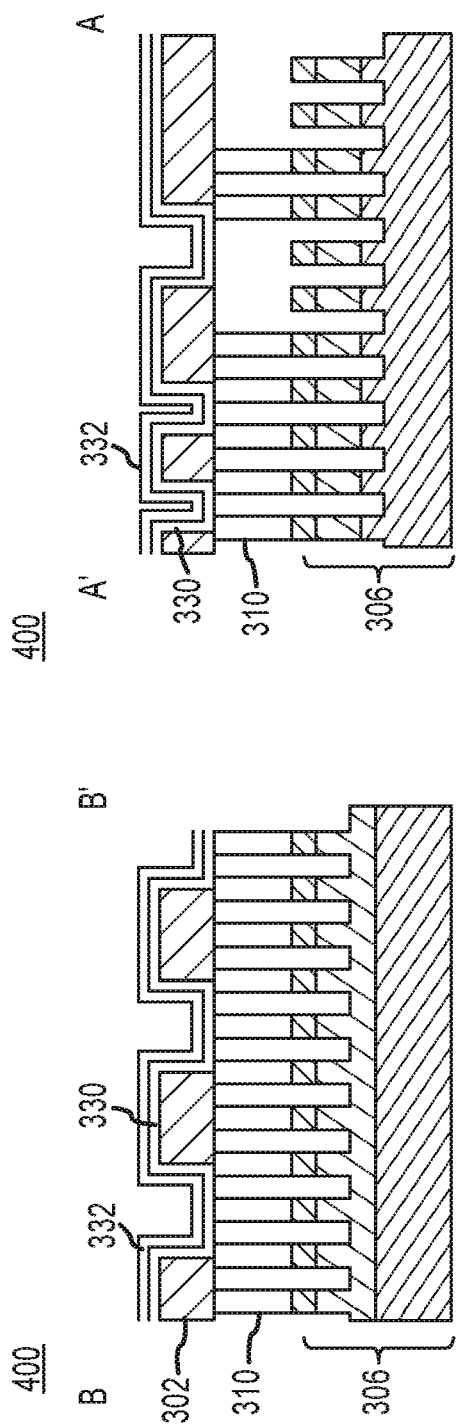

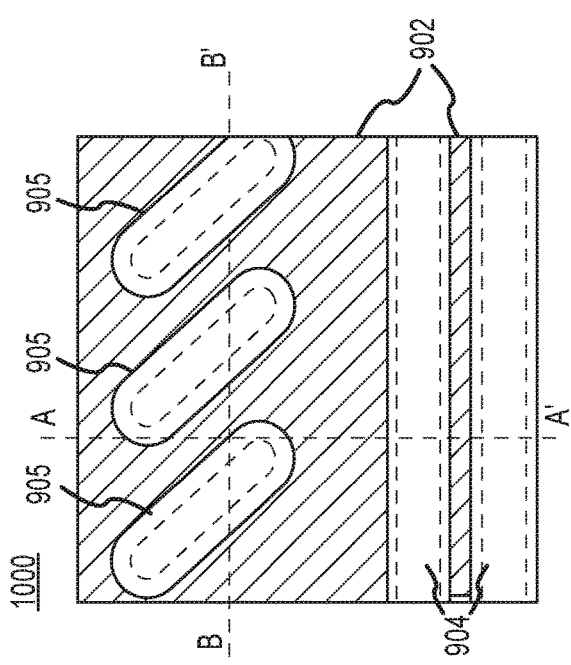
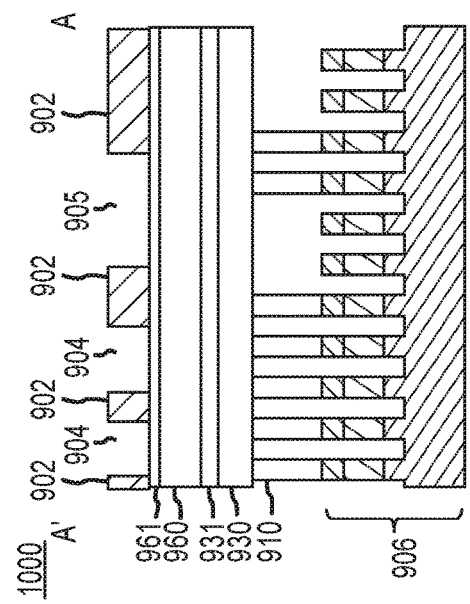
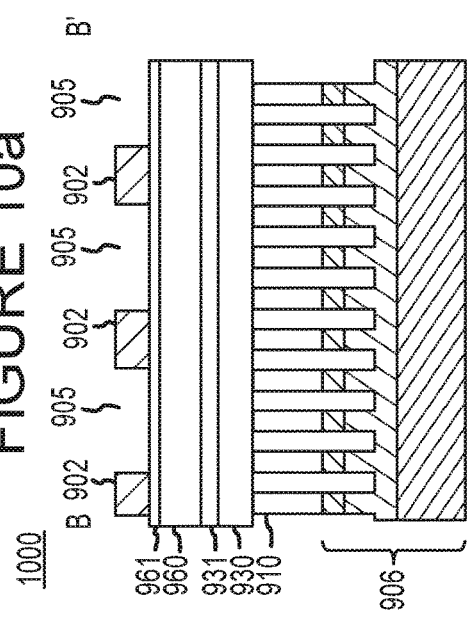

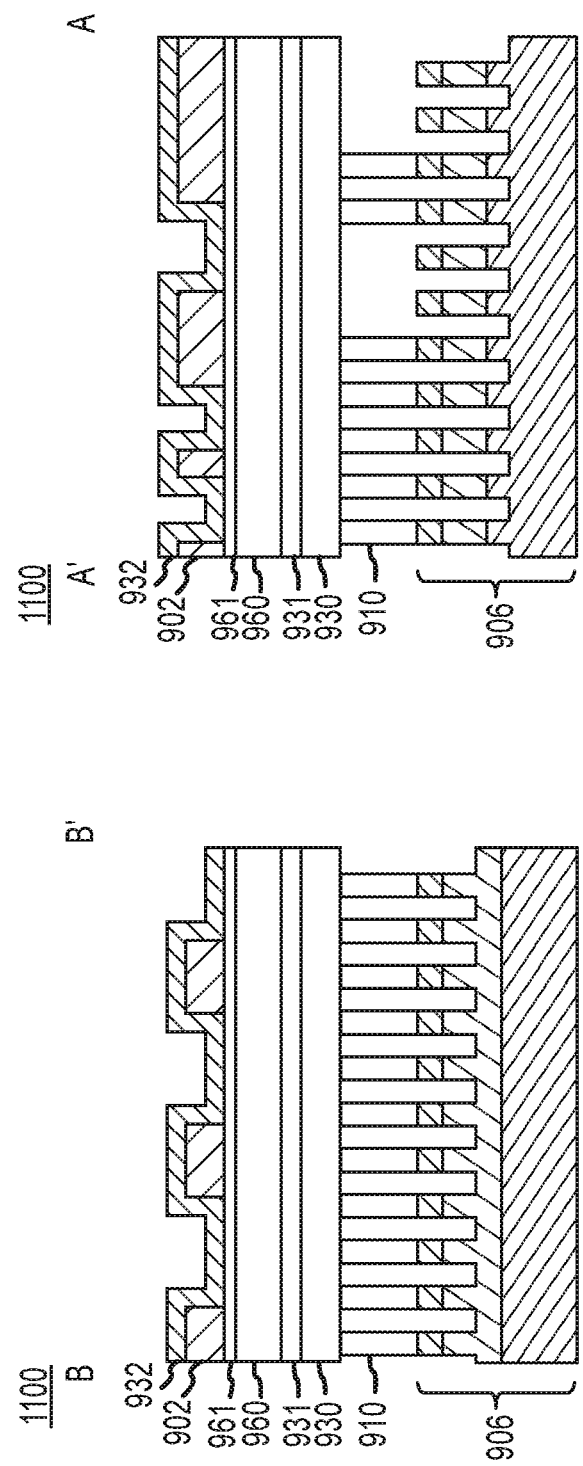

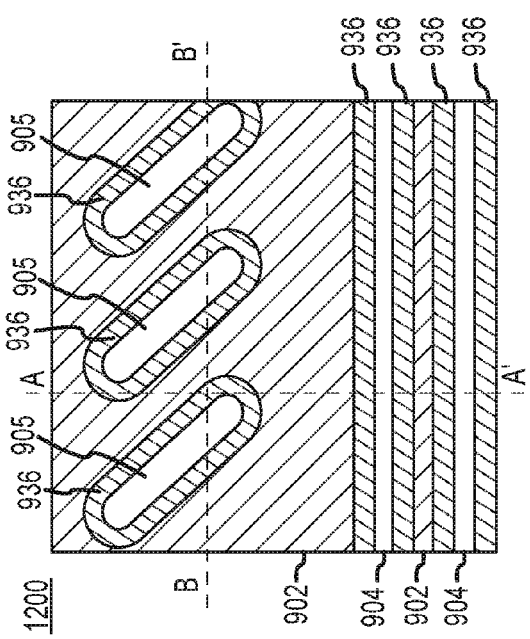
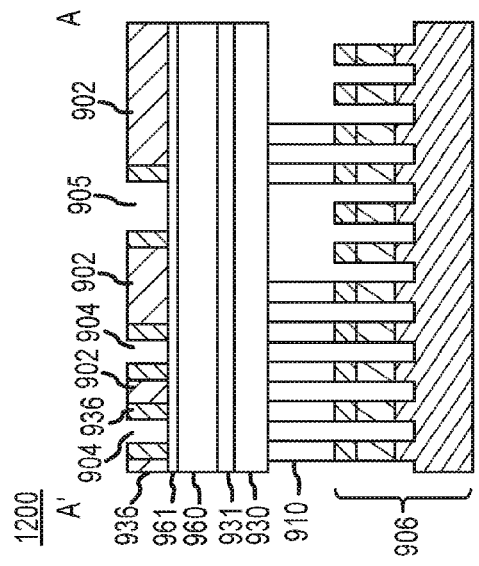
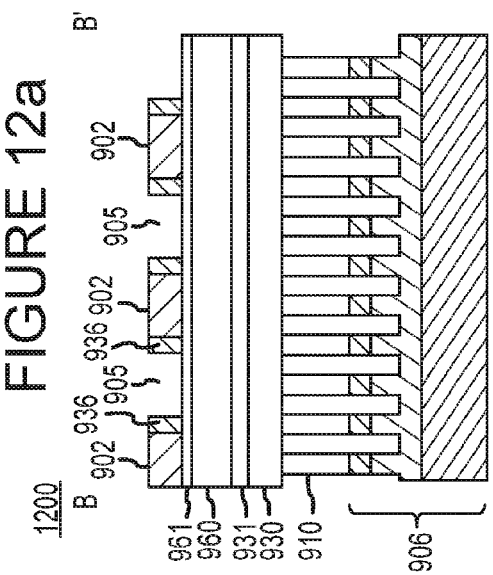
FIGURE 12a
FIGURE 12b
FIGURE 12c

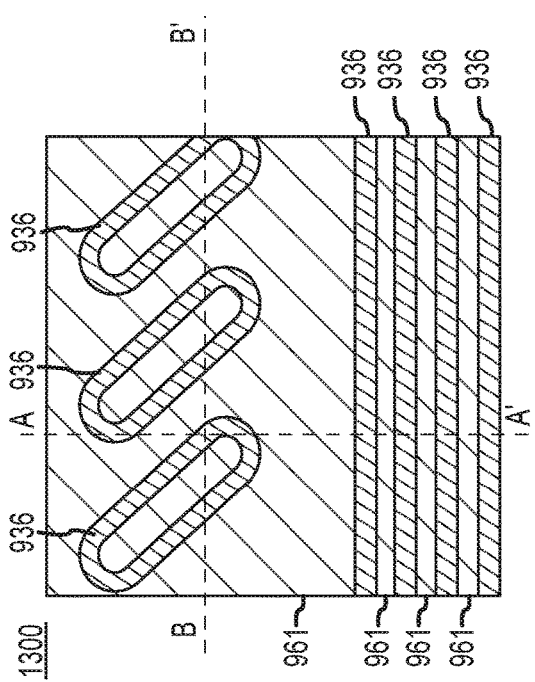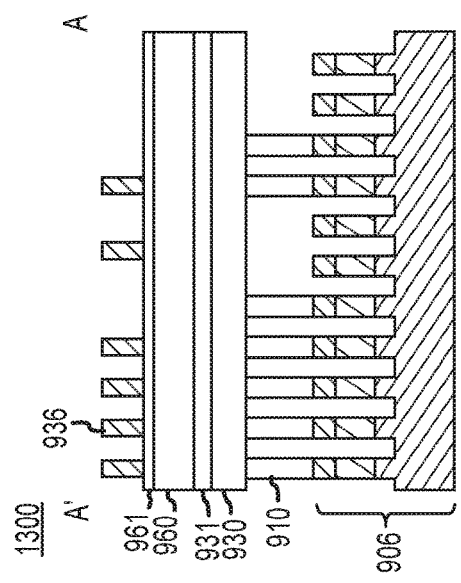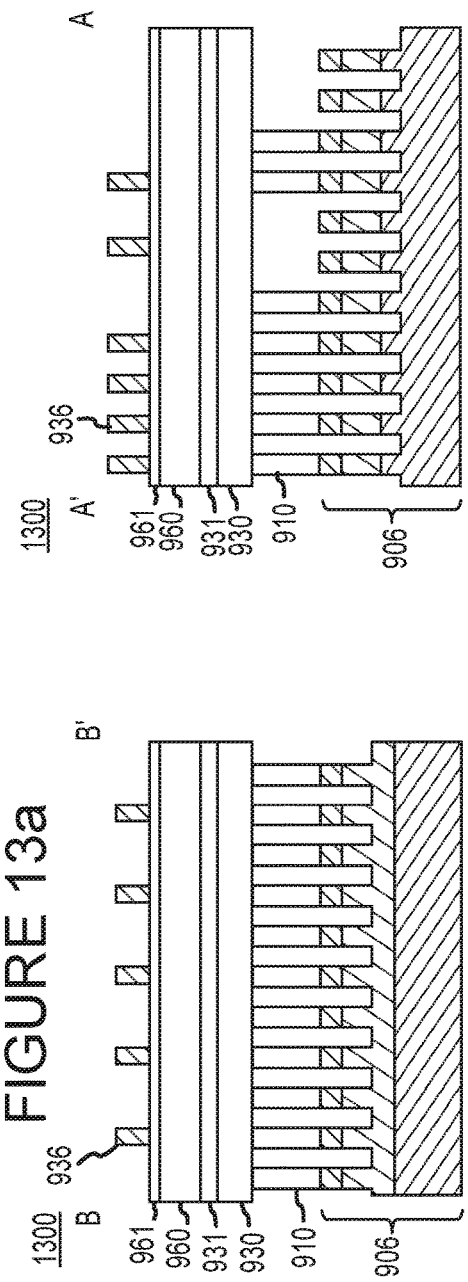

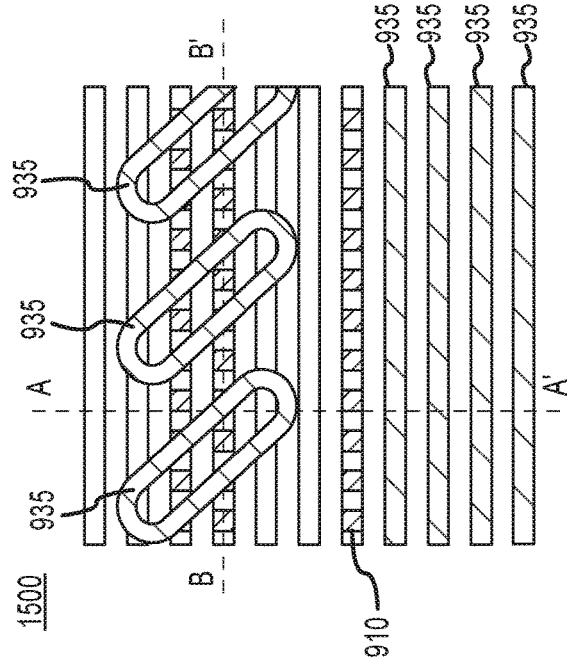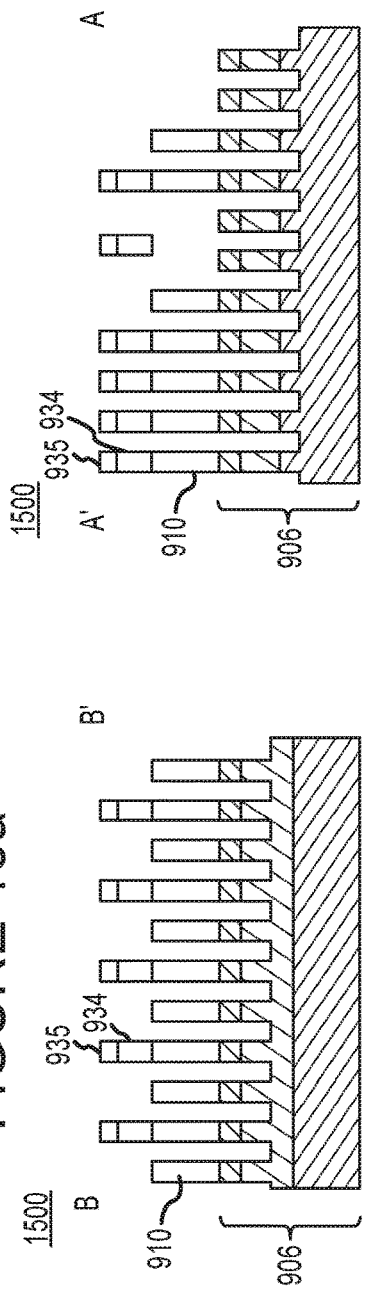
FIGURE 15a
FIGURE 15b
FIGURE 15c

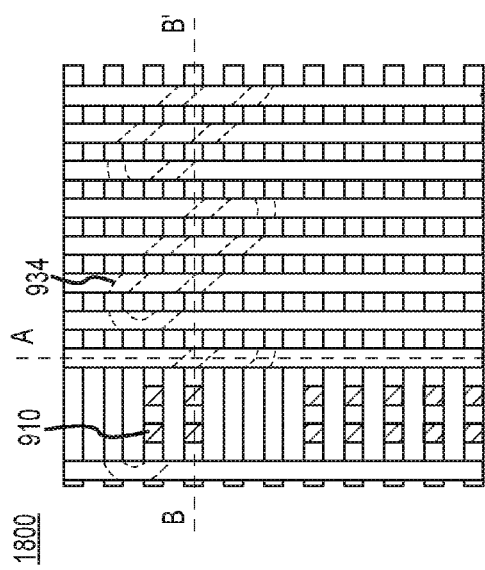
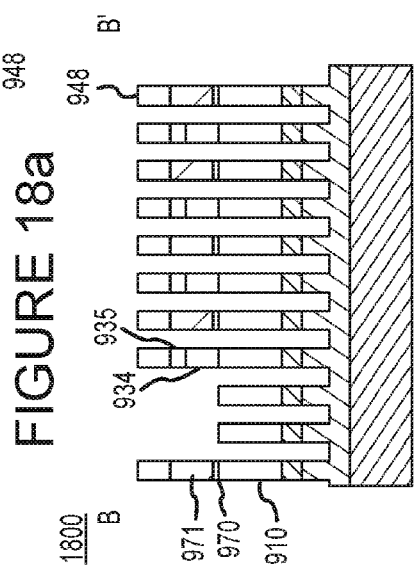
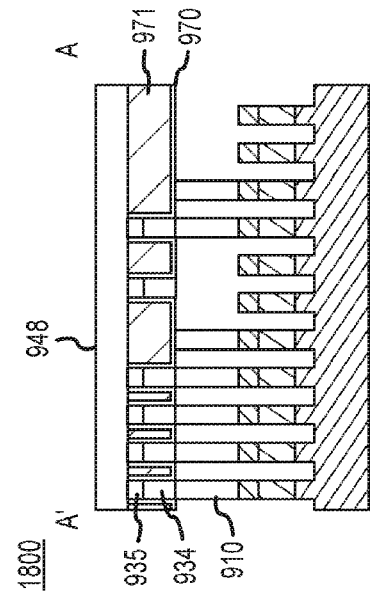
FIGURE 18a
FIGURE 18b
FIGURE 18c

US 10,141,508 B2

CLAMP ELEMENTS FOR PHASE CHANGE MEMORY ARRAYS

CROSS REFERENCE TO RELATED APPLICATIONS

This application is a divisional of U.S. patent application Ser. No. 13/783,884, filed Mar. 4, 2013, and issued as U.S. Pat. No. 9,520,554 on Dec. 13, 2016. The aforementioned application is incorporated herein by reference, in its entirety, for any purpose.

TECHNICAL FIELD

Embodiments of the present invention relate generally to semiconductor memory, and more specifically, in one or more described embodiments, to clamp elements for an array of phase change memory.

BACKGROUND

Ongoing development of electronic devices, such as mobile communication devices, media players, and computers, have led to an increasing demand for semiconductor memory having high operating frequencies, storage capabilities, and power efficiency.

One approach that has been adopted to achieve these improvements in a memory is to increase memory density; that is, to increase the number of memory cells in a given amount of physical space. In some memories, however, increased density can lead to generation of high coupling capacitances between bit lines during programming operations. More precisely, programming a cell on a bit line may generate spurious currents on neighboring unaddressed bit lines, which may result in data corruption in cells coupled to the unaddressed bit lines.

While some memories include clamp elements to account for the coupling capacitance, often times the structure and/or feature sizes of memories having relatively high memory densities may be such that fabricating such clamp elements may not be possible, or may present significant challenges in forming the clamp elements in a desired manner.

SUMMARY

Embodiments of the present invention are directed to clamp elements for phase change memory arrays. According to one embodiment, a memory is disclosed. The memory may include an array of memory cells. The memory may further include first and second voltage control word lines arranged outside of the array of memory cells, wherein the first and second voltage control word lines are adjacent to one another. The memory may further include a plurality of clamp elements, each clamp element of the plurality of clamp elements including a wall self-heating type cell structure oriented non-orthogonally relative to at least one of a respective bit line and a respective one of the first and second voltage control word lines and configured to control a voltage of a respective bit line, wherein the self-heating type cell structure includes a cap, a chalcogenic material, and a switch, and wherein the chalcogenic material is both self-heating and a phase change material, wherein alternating ones of the plurality of clamp elements are arranged on alternating ones of the first and second voltage control word lines.

BRIEF DESCRIPTION OF THE DRAWINGS

FIG. 3a is a plan-view diagram of a structure according to an embodiment of the invention. FIGS. 3b and 3c are side-view diagrams along two orthogonal directions of a structure according to an embodiment of the invention.

FIGS. 4a and 4b are side-view diagrams along two orthogonal directions of a structure according to an embodiment of the invention.

FIG. 10a is a plan-view diagram of a structure according to an embodiment of the invention. FIGS. 10b and 10c are side-view diagrams along two orthogonal directions of a structure according to an embodiment of the invention.

FIGS. 11a and 11b are side-view diagrams along two orthogonal directions of a structure according to an embodiment of the invention.

FIG. 12a is a plan-view diagram of a structure according to an embodiment of the invention. FIGS. 12b and 12c are side-view diagrams along two orthogonal directions of a structure according to an embodiment of the invention.

FIG. 13a, is a plan-view diagram of a structure according to an embodiment of the invention. FIGS. 13b and 13c are side-view diagrams along two orthogonal directions of a structure according to an embodiment of the invention.

FIG. 15a is a plan-view diagram of a structure according to an embodiment of the invention. FIGS. 15b and 15c are side-view diagrams along two orthogonal directions of a structure according to an embodiment of the invention.

FIG. 18a is a plan-view diagram of a structure according to an embodiment of the invention. FIGS. 18b and 18c are side-view diagrams along two orthogonal directions of a structure according to an embodiment of the invention.

DETAILED DESCRIPTION

Clamp elements for memories, for example, phase change memory, and methods for forming the same are disclosed herein. In accordance with one or more described embodiments, cell structures of clamp elements may be formed non-orthogonally (e.g., at a 45-degree angle relative to word lines or bit lines of an array). Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention. Furthermore, the drawings provided herein may not necessarily be drawn to scale, including the thicknesses of the various materials relative to one another. Also, relative and directional references (e.g., above, below, over, etc.) are given by way of example to aid the reader's understanding of the particular embodiments described herein, and should not be read as requirements or limitations except as specifically set forth in the claims. As described herein, directional references directed to illustrating a directional relationship of two or more components do not exclude the inclusion of additional components adjacent, between, and/or proximate the two or more components unless specifically stated (e.g., directly above).

Examples of the present invention may relate generally to phase change memory cells. Phase change memory cells may include elements of group VI of the periodic table, such as Tellurium (Te) or Selenium (Se), referred to as chalcogenides or chalcogenic material. The phase change material $Ge_2Sb_2Te_5$ (GST), for example, may be used in phase change memory cells as a result of the distinct electrical characteristics displayed by the material in various physical states. Such states may include an amorphous state and a crystalline state and/or one or more intermediate states between the amorphous and crystalline states. Because chalcogenide materials remain stable after power is removed, phase change memory cells may be used to implement non-volatile memory.

Figure 1:
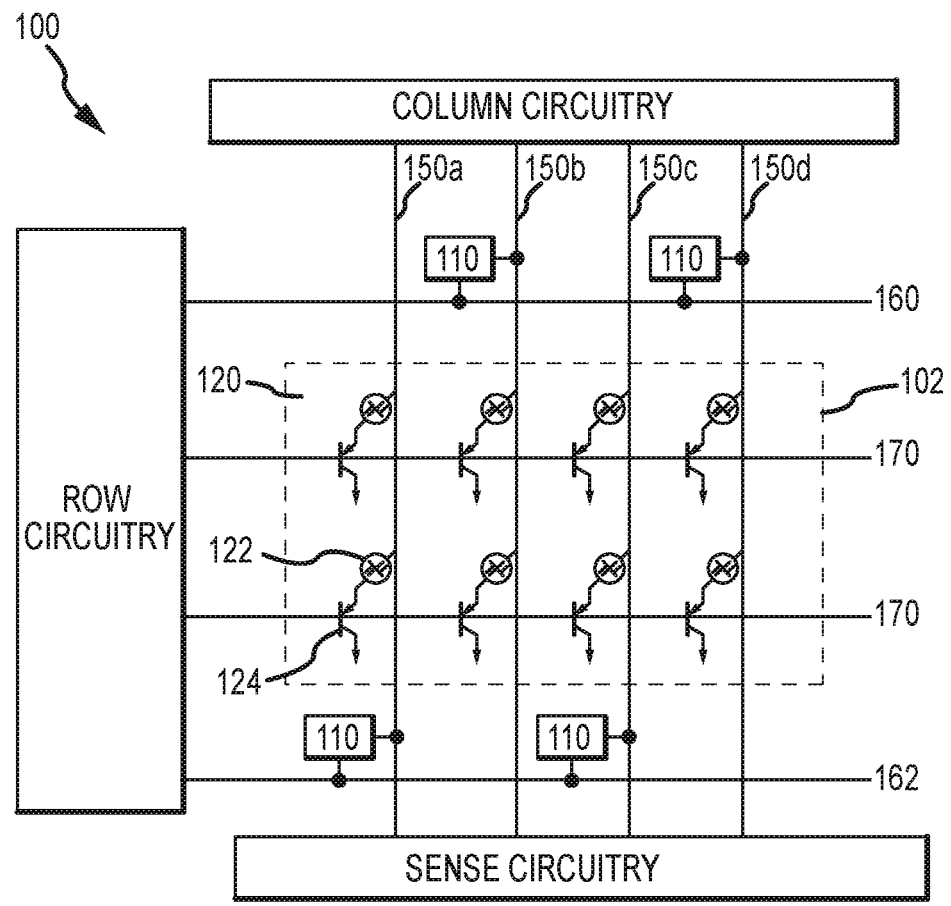
FIG. 1 is a schematic diagram of a portion of a memory according to an embodiment of the invention.

FIG. 1 is a schematic diagram of a portion of a memory 100 according to an embodiment of the invention. The memory 100 may include an array 102 having a plurality of cells 120 (e.g., PCM cells). Each of the cells 120 may include a storage element 122 configured to store one or more bits of data and a switch 124 configured to allow data to be selectively read from or programmed to the storage element 122. Each cell 120 may be coupled to a respective bit line 150 and a respective word line 170, and may be located at the crossing of the respective bit line 150 and word line 170 for the cell 120. Each cell 120 further may be addressable by selection of the associated bit line 150 and word line 170. While each switch 124 is illustrated as a bipolar junction transistor (BJT), it will be appreciated that other switches known in the art, now or in the future, may be used. For example, in other embodiments, one or more switches 124 may comprise a field effect transistor (e.g., n-type or p-type FET) or a diode. As illustrated in FIG. 1, the cells 120 may be grouped in subsets of four cells in the direction of the word lines 170. In other embodiments, other subset sizes may be used, such subsets having 8, 16, or 32 cells.

To program a cell 120, a programming voltage, e.g., a voltage greater than a threshold voltage of a switch 124, is applied to a base of a switch 124 using a word line 170. An inhibition voltage, e.g., a bit line programming voltage, is applied to other unaddressed word lines 170, thereby preventing any state changes in other storage elements 122. In this manner, any number of cells on a respective word line 170 may be simultaneously addressed.

When a cell 120 is programmed, an electrical current flows through the addressed cell 120 thereby heating local chalcogenic material at or above a melting temperature of the material. The chalcogenic material is then allowed to cool in a controlled manner such that the desired state of the cell is achieved. More precisely, rapid cooling may place the material in the amorphous state that may, for instance, correspond to a binary "0". Conversely, slower cooling may place the material in the crystalline state that may, for instance, correspond to a binary 1. Intermediate states may be achieved by cooling the material at rates interpolated between the rates for cooling used for placing the material in the amorphous and crystalline states. In some embodiments, heating the chalcogenic material at a temperature lower than the melting temperature for a particular period of time may place the material in the crystalline state. Thus, in some instances, a cell 120 may be programmed by setting the amplitude and pulse width of the current provided to the cell 120.

The memory 100 may further include a plurality of clamp elements 110 that each may be coupled to a respective bit line 150 and a voltage control word line 160, 162. During programming, clamp elements 110 may be used to prevent undesirable programming of unaddressed cells 120. As illustrated, the clamp elements 110 may be arranged in two subsets, one for odd bit lines (e.g., bit lines 150a and 150c) and one for even bit lines (e.g., bit lines 150b and 150d). Voltage control word lines 160, 162 may be provided to respective subsets of the clamp elements 110.

As illustrated, both subsets of clamp elements 110 may be located outside the array 102, with the subset for odd bit lines on a side of the array 102 and the subset for even bit lines on an opposing side of the array 102. In another embodiment, both subsets may be located on a same side of the array 102. In yet another embodiment, clamp elements 110 for odd and even bit lines may be located on both sides of the array 102. In yet another embodiment, the array 102 may be physically divided into multiple regions and clamp elements 110 may be interposed between one or more of the regions.

During a programming operation, one or more clamp elements 110 may control the voltage of an unaddressed bit line 150 to help prevent programming of cells 120 on the unaddressed bit line 150 adjacent to an addressed bit line 150. By "clamping" the voltage of the unaddressed bit line 150, the voltage of the bit line 150 may be controlled such that the voltage does not exceed a tolerable value. More precisely, a clamp element 110 may reduce capacitive coupling, for instance, between bit lines, and/or parasitic leakage between switches 124 coupled to a same word line. For example, if bit line 150c is addressed, clamp elements 110 coupled to bit lines 150b and 150d may control the voltage of their respective bit lines 150. In another example, if bit line 150d is addressed, clamp element 110 coupled to bit line 150c may control the voltage of the bit line 150c.

In at least one embodiment, clamp elements 110 may include a storage element, such as a storage element 122 as previously described with respect to a cell 120. The storage element of a clamp element 110 may, for instance, be in a crystalline state. Based, at least in part, on an inhibition voltage, a clamp element 110 may drain current such that a voltage of a bit line 150 does not exceed the threshold voltages of any switch 124 coupled to the bit line 150.

In another embodiment, clamp elements 110 may include a voltage control transistor (not shown). The gate of each voltage transistor may be coupled to a respective voltage control word line and in response to an inhibition voltage, a supply voltage may be coupled to a bit line 150 through the voltage control transistor.

In yet another embodiment, clamp elements 110 may alternatively or additionally include a voltage control diode (not shown). During ramp down of the programming voltage of a bit line 150, the voltage of adjacent bit lines 150 may also decrease. If this decrease is high enough in magnitude, the voltage drop may cause a switch 124 to be activated and potentially program an unaddressed cell 120. Thus, a voltage control diode may be used to maintain the voltage of the bit line during ramp down of the programming voltage applied to a bit line 150.

Figure 2A:
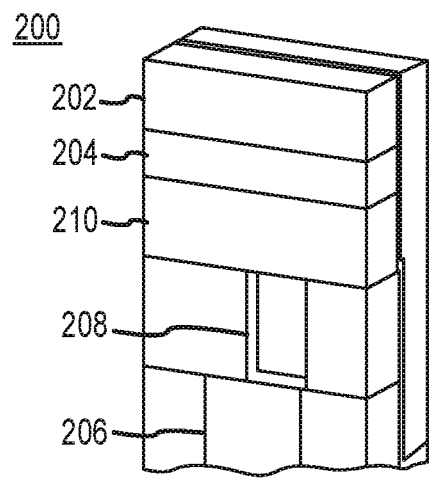
FIG. 2a is a cross-section diagram of a cell structure according to an embodiment of the invention.
Figure 2B:
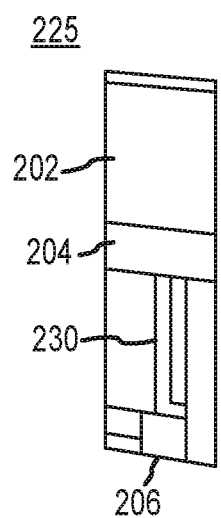
FIG. 2b is a cross-section diagram of a cell structure according to an embodiment of the invention.
Figure 2C:
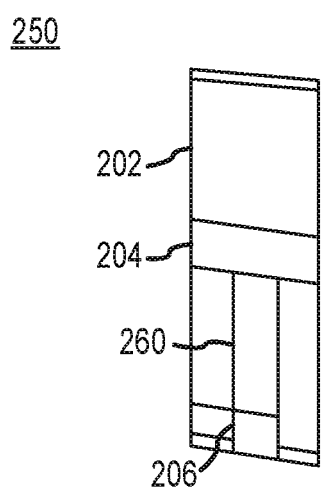
FIG. 2c is a cross-section diagram of a cell structure according to an embodiment of the invention.

Various types of phase change memory cell structures may be used to implement the phase change memory cells 120 and/or the clamp elements 110 described with reference to FIG. 1. In particular, the cell structures may be used to implement the storage elements 122. The type of cell structure implemented may be based, at least in part, on the manner in which the cells 120 and/or clamp elements 110 are formed. FIGS. 2a-2c describe example cell structures.

FIG. 2a is a cross-section diagram of a cell structure 200 according to an embodiment of the invention. The cell structure 200 may be a "wall" type cell structure and may be used to implement, at least in part, a cell 120 of FIG. 1 and/or a clamp element 110 of FIG. 1. The cell structure may include a metal bit line 202 and a bit line cap 204 that may comprise a bit line, such as a bit line 150 of FIG. 1. The metal bit line 202 may be any bit line known in the art, now or in the future, and will not be further discussed in the interest of brevity. The bit line cap 204 may be a conductive material, such as titanium nitride (TiN), and may be configured to operate as a conductive barrier between the bit line 202 and other components of the cell structure 200.

The cell structure 200 may further include a chalcogenic material 210 (e.g., GST) that may be formed between the bit line cap 204 and a conductive element 208 configured to change the state of at least a portion of the chalcogenic material element 210 during programming of the cell structure 200. The conductive element 208 may be coupled to a switch 206 that, as described, may comprise a bipolar junction transistor. In one embodiment, the conductive element 208 may be coupled directly to the emitter of the switch 206 or may be coupled to the emitter of the switch 206 through a contact (not shown).

In a programming operation of the cell structure 200, a word line (not shown) may be selectively addressed and enable the switch 206. A programming voltage may be applied to the metal bit line 202 and current may flow through the cell structure 200. More precisely, current may flow through the chalcogenic material element 210 and the conductive element 208. While current is provided through the conductive element 208, the conductive element 208 may increase in temperature, and as a result, a region of the chalcogenic material element 210 near the conductive element 208 may also increase in temperature, for instance, above the melting temperature of the chalcogenic material element 210. As described, based, at least in part, on the manner in which the chalcogenic material element 210 is thereafter allowed to cool, the chalcogenic material element 210 near the conductive element 208 may be in an amorphous state, a crystalline state, or an intermediate state. In this manner, the cell may be programmed with a binary value corresponding to the resulting state of the chalcogenic material element 210.

FIG. 2b is a cross-section diagram of a cell structure 225 according to an embodiment of the invention. The cell structure 225 may be a "wall self-heating" type cell structure and may be used to implement, at least in part, a cell 120 of FIG. 1 and/or a clamp element 110 of FIG. 1. The cell structure 225 includes elements that have been previously described with respect to the cell structure 200 of FIG. 2a. Those elements have been shown in FIG. 2b using the same reference numbers used in FIG. 2a and operation of the common elements is as previously described. Consequently, a detailed description of the operation of these elements will not be repeated in the interest of brevity.

As will be explained in more detail below, in contrast to the cell structure 200 of FIG. 2a, the cell structure 225 may include a chalcogenic material element 230 in lieu of the conductive element 208 and the chalcogenic material element 210 of the cell structure 200. The chalcogenic material element 230 (e.g., GST) may be formed between the switch 206 and the bit line cap 204 as shown.

The "wall" and "wall self-heating" structures described herein include a conductive element 208 and chalcogenic material element 230, respectively. The "wall" term, in at least one embodiment, may refer to the relatively narrow and/or vertical nature of these respective elements of the structures.

FIG. 2c is a cross-section diagram of a cell structure 250 according to an embodiment of the invention. The cell structure 250 may be a "subtractive self-heating" type cell structure and may be used to implement, at least in part, a cell 120 of FIG. 1 and/or a clamp element 110 of FIG. 1. The cell structure 250 includes elements that have been previously described with respect to the cell structure 200 of FIG. 2a. Those elements have been shown in FIG. 2c using the same reference numbers used in FIG. 2a and operation of the common elements is as previously described. Consequently, a detailed description of the operation of these elements will not be repeated in the interest of brevity.

As will be explained in more detail below, the cell structure 250 may include a chalcogenic material element 260 in lieu of the conductive element 208 and the chalcogenic material element 210 of the cell structure 200. In contrast to the cell structure 225, the chalcogenic material element 260 may have a different physical shape than the chalcogenic material element 230 of the cell structure 225 of FIG. 2b. That is, the chalcogenic material element 260 may have a substantially pillar shape.

In a programming operation of a cell structure 225 or a cell structure 250, a word line (not shown) may be selectively addressed and enable the switch 206. A programming voltage may be applied to the metal bit line 202, and current may flow through the cell structure, including the chalcogenic material element (e.g., chalcogenic material element 230 or chalcogenic material element 260). The chalcogenic material element may increase in temperature, for instance, above the melting temperature of the chalcogenic material. Based, at least in part, on the manner in which the chalcogenic material element is thereafter allowed to cool, the chalcogenic material element may be in an amorphous state, a crystalline state, or an intermediate state. Accordingly, the cell may be programmed with a binary value corresponding to the resulting state of the chalcogenic material element.

While cell structures 200, 225, and 250 are illustrated as including the aforementioned components, it will be appreciated that other components may be included in the cell structures as well, such as masks (e.g., photomasks), other caps and/or various dielectrics that may be configured to electrically isolate various components of a respective cell structure.

As previously discussed, clamp elements, such as the clamp elements 110, may include cell structures such as those described herein. In at least one embodiment, cell structures of clamp elements may be formed non-orthogonally, such as at a 45-degree or 60-degree angle, relative to word lines or bit lines of an array. By way of example, mask and/or mask holes used in formation of the cell structures may be formed at non-orthogonal angles. Additionally, or alternatively, other elements of a cell structure, such as a heating element, may be formed at anon-orthogonal angle. In one embodiment, for instance, the angle by which a heating element is formed may be based, at least in part, on the angle at which a mask or mask hole is formed.

Forming cell structures in this manner may, for instance, eliminate or mitigate a need for mask chopping used to form clamp elements on respective bit lines. Additionally, this approach may allow for the formation of additional cell structure based, at least in part, on the length of the non-orthogonal pattern and/or may further allow for formation of clamp elements in memories having a variety of densities, e.g., by adjusting the angle by which the clamp elements are formed. Thus, in accordance with one or more embodiments of the invention, FIGS. 3a-7c are directed to a process by which cell structures of clamp elements may be formed non-orthogonally. The process may be used, for instance, to form wall cell structures.

FIG. 3a is a plan-view diagram of a structure 300 according to an embodiment of the invention and FIGS. 3b and 3c are side-view diagrams along two orthogonal directions of the structure 300. FIG. 3b may be a cross-sectional view of the structure 300 along a line labeled B-B', which may be along a word line direction. FIG. 3c may be a cross-sectional view of the structure 300 along a line labeled A-A', which may be along a bit line direction. The structure 300 may include a mask material 302, mask holes 304, mask holes 305, and contacts 310. The mask material 302 may comprise a nitride material and mask holes 304, 305 may be formed in the mask material 302. With reference to FIGS. 3b and 3c, the mask material 302 and the mask holes 304, 305 may be formed over the contacts 310, each of which may be in turn formed over a respective switch 306. Each switch 306 may share a substrate that in one embodiment may be configured to operate as a collector. The mask holes 304 may be formed over rows associated with cells and holes 305 may be formed over rows associated with clamp elements.

As illustrated in FIG. 3a, in at least one embodiment, mask holes 304 may be substantially parallel to rows of contacts 310 and mask holes 305 may be formed at a non-orthogonal angle (e.g., a 45-degree angle) relative to a row of contacts 310 (e.g., contacts aligned in a bit line direction or a word line direction). Moreover, mask holes 304 and mask holes 305 may be formed with different pitches. The pitch may comprise, for instance, the width of a mask hole in a word line direction and the distance between the mask hole and an adjacent mask hole in a word line direction, or the pitch may comprise the width of a mask hole in a bit line direction and the distance between the mask hole and an adjacent mask hole in the bit line direction. In at least one embodiment, pitches for mask holes 305 may be determined in the word line direction and pitches for mask holes 304 may be determined in the bit line direction. By way of example, in at least one embodiment, mask holes 305 may have 1.5× or 2× the pitch of mask holes 304. It will be appreciated by those having ordinary skill in the art, however, that each mask hole 304, 305 may each have any desired pitch.

In some instances, the angle at which mask holes 305 are formed may vary. For example, the angle of the mask holes 305 (or mask in a clear field mask process) may be determined based on the size and separation of the contacts 310 in one or more of the word line and bit line directions. In at least one embodiment, the mask holes 305 may be formed such that the sidewall of the mask hole is substantially aligned with the center of one or more contacts 310. Thus, the angle of a mask hole 305 may be based, at least in part, on the distance between centers of adjacent contacts 310 in a bit line direction and/or the distance between the center of adjacent contacts 310 in a word line direction. More precisely, the angle may be based, at least in part, on the ratio of the two distances. In at least one embodiment, the angle may be equal to the arc tangent of the value equal to the distance between centers of adjacent contacts 310 in a bit line direction divided by the distance between the center of adjacent contacts in a word line direction. In some embodiments, the distance between centers of adjacent contacts 310 in a word line direction may differ (e.g., larger or smaller) from the distance between the center of adjacent contacts 310 in a bit line direction. In some embodiments, the distance between centers of adjacent contacts 310 for rows associated with cells may differ from the distance between centers of adjacent contacts 310 for rows associated with clamp elements. In this manner, distances may differ in a word line direction and/or in a bit line direction.

FIGS. 4a and 4b are side-view diagrams along two orthogonal directions of a structure 400 according to an embodiment of the invention. The two orthogonal directions are shown along lines B-B' and A-A' in FIGS. 4a and 4b, respectively, which may also correspond to the lines B-B' and A-A' of the structure 300 of FIG. 3. The structure 400 may include the structure 300 as well as a conductive material 330 and a spacer material 332. The conductive material 330 may be may be any conductive material, such as titanium silicide nitride (TiSiN), or chalcogenic material, such as GST, and may be formed over the mask material 302 and in the mask holes 304, 305. Forming the conductive material 330 and the spacer material 332 in the mask holes may include forming the conductive material 330 and the spacer material 332 over portions of the contacts 310 exposed in the mask holes 304, 305. The structure 400 may further include a spacer material 332 that may be formed over the conductive material 330, for instance, using any dielectric and/or nonconductive material (e.g., nitride) known in the art, now or in the future.

Figure 5B:
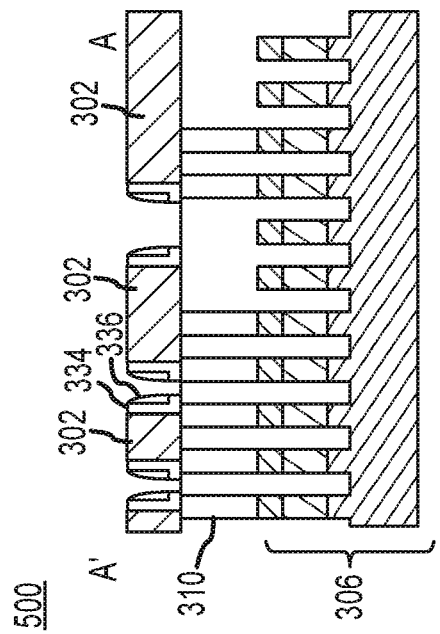
FIGS. 5a and 5b are side-view diagrams along two orthogonal directions of a structure according to an embodiment of the invention.
Figure 5A:
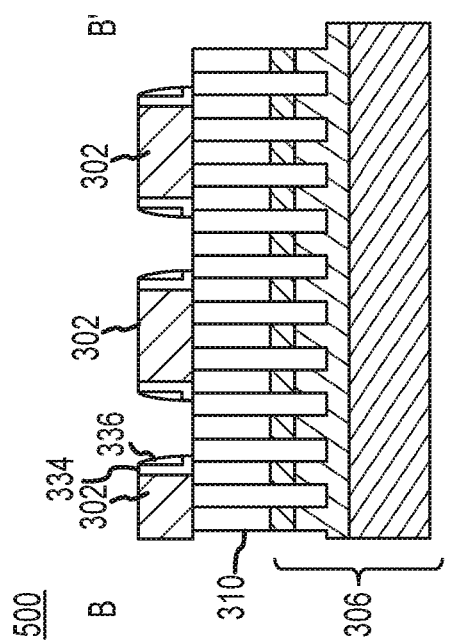

FIGS. 5a and 5b are side-view diagrams along two orthogonal directions of a structure 500 according to an embodiment of the invention. The two orthogonal directions are shown along lines B-B' and A-A' in FIGS. 5a and 5b, respectively, which may also correspond to the lines B-B' and A-A' of the structure 400 of FIGS. 4a and 4b. The structure 500 may include at least a portion of the structure 400. As illustrated, relative to the structure 400, portions of the conductive material 330 and the spacer material 332 may be removed such that the horizontal portions of the conductive material 330 and the spacer material 332 are substantially removed to leave portions of the conductive material 330 and the spacer material 332 in the mask holes 304, 305. Portions of the conductive material 330 and portions of the spacer material 332 may be removed by any approach known in the art, now or in the future, including etching. By removing the portion of the conductive material 330 and the spacer material 332 in this manner, a plurality of conductive elements 334 and spacer elements 336 may be formed over the contacts 310 within the mask holes 304, 305. The conductive elements 334 may, for instance, correspond to the conductive elements 208 of FIG. 2a and/or the chalcogenic material 230 of FIG. 2b.

Figure 6C:
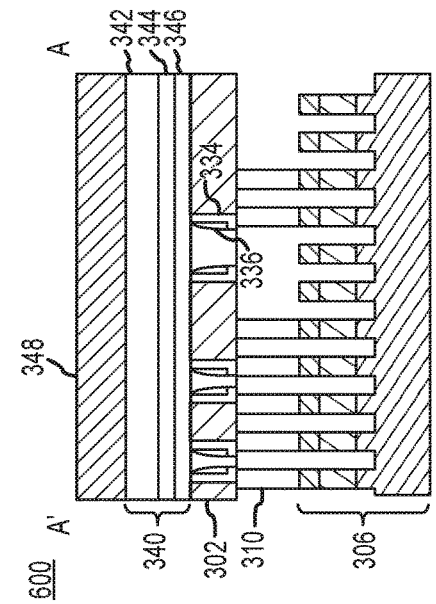
FIGS. 6b and 6c are side-view diagrams along two orthogonal directions of a structure according to an embodiment of the invention.
Figure 6A:
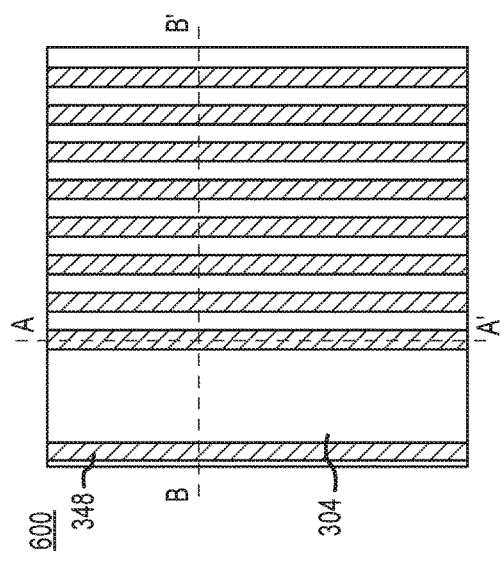
FIG. 6a is a plan-view diagram of a structure according to an embodiment of the invention.
Figure 6B:
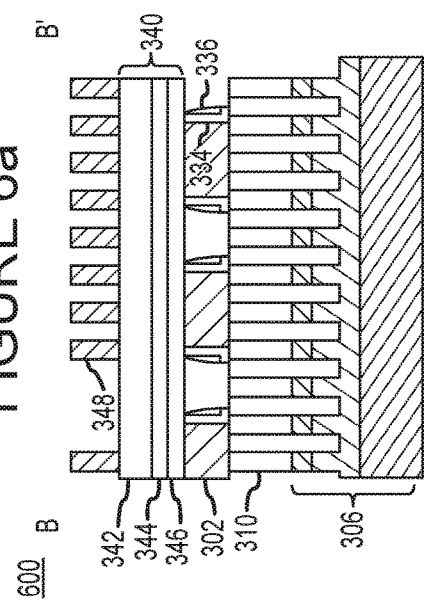

FIG. 6a is a plan-view diagram of a structure 600 according to an embodiment of the invention. FIGS. 6b and 6c are side-view diagrams along two orthogonal directions of the structure 600. FIGS. 6b and 6c may be cross-sectional views of the structure 600 taken along lines B-B' and A-A', respectively. The structure 600 may include the structure 500 and further may include a bit line material 340 and bit line mask 348. With reference to FIGS. 6b and 6c, the bit line material 340 may include a metal bit line material 342, a bit line cap material 344, and a chalcogenic material 346. The bit line mask 348 may be formed over the bit line material 340 and configured to form a bit line pattern over the bit line material 340. The pattern of the hit line mask 348 may be formed using semiconductor manufacturing methods, known now or in the future, and the bit line mask 348 may comprise any known mask material, such as a nitride (e.g., silicon nitride).

Figure 7A:
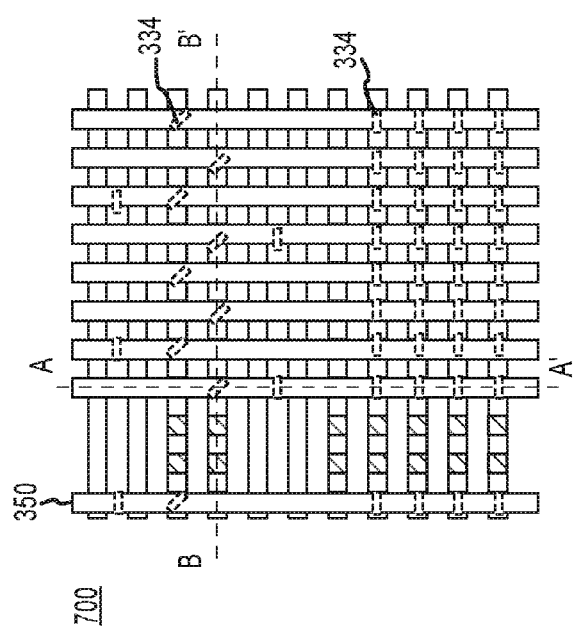
FIG. 7a is a plan-view diagram of a structure according to an embodiment of the invention.
Figure 7B:
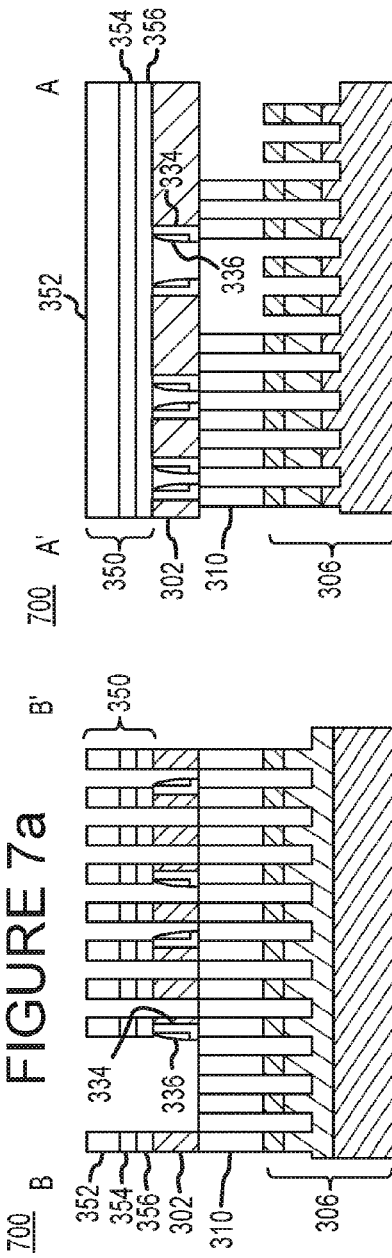
FIGS. 7b and 7c are side-view diagrams along two orthogonal directions of a structure according to an embodiment of the invention.
Figure 7C:
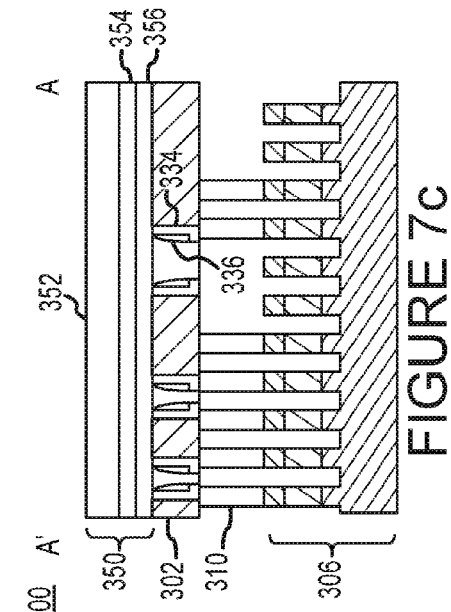

FIG. 7a is a plan-view diagram of a structure 700 according to an embodiment of the invention. FIGS. 7b and 7c may be cross-sectional views of the structure 600 taken along lines B-B' and A-A', respectively. FIGS. 7b and 7c are side-view diagrams along two orthogonal directions of the structure 700. The structure 700 may include at least a portion of the structure 600. As illustrated, with reference to FIG. 7b, portions of the bit line material 340 may be removed to form a plurality of bit lines 350. In at least one embodiment, the portions removed may be the exposed portions of the bit line material 340 between portions of the bit line mask 348 (FIGS. 6a, 6b, and 6c). The bit line mask 348 may also be removed. Removing portions of the bit line material 340 and the bit line mask 348 in this manner may, for instance, create bit lines 350 in the pattern formed using the bit line mask 348. Because each of the hit lines 350 may be formed from one or more portions of the bit line material 340, each of the bit lines 350 may include a metal bit line 352, a bit line cap 354, and a chalcogenic material 356.

As illustrated in FIG. 7a, conductive elements 334 formed in the mask holes 305 may be formed non-orthogonally relative to a row of contacts 310. Conversely, conductive elements 334 formed in mask holes 304 may be positioned orthogonally to the bit lines 350. The conductive elements 334 formed in the mask holes 305 may be included in cell structures used to implement clamp elements as described herein. While the conductive elements 334 are shown in FIG. 7a, it will be appreciated that the conductive elements 334 are not exposed, but rather are shown only in the interest of clarity.

Accordingly, a bit line 350, conductive element 334, contact 310 and switch 306 may form a cell structure, such as the cell structure 200 of FIG. 2a, which may be used as a clamp element 120 or a cell 110 of FIG. 1. With reference to FIG. 7a, in at least one embodiment, those cell structures formed non-orthogonally relative to one or more bit lines and/or one or more word lines may comprise clamp elements and those formed orthogonally may comprise cells.

While the aforementioned process may be used to form wall type cell structures, in other embodiments, the process, or variations thereof, may be used to form other cell structures, such as wall self-heating cell structures. For example, as described, the conductive material 330 of FIG. 4 may comprise a chalcogenic material. In such instances, the chalcogenic material 346 of the bit line material 340 as described with respect to FIG. 6a need not be formed, resulting in the bit line cap 354 being formed directly over the conductive elements 334. Accordingly, using the described modified process, a wall self-heating cell structure may be formed.

Figure 8:
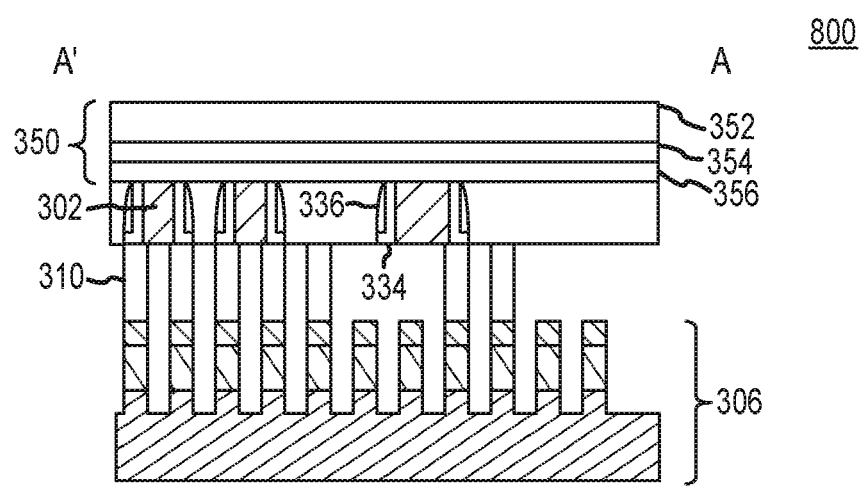
FIG. 8 is a side-view diagram of a structure according to an embodiment of the invention.

Additionally, while the aforementioned process has been described with respect to a dark field mask polarity, a clear field mask polarity may be used as well. That is, the respective locations of mask 302 and mask holes 304, 305 of FIG. 3a may be inversed. By way of example, FIG. 8 is a side-view diagram of a structure 800 according to an embodiment of the invention after formation of bit lines using a clear field process. FIG. 8 may be a cross-sectional view taken along the line A-A' of the structure 300 of FIG. 3, for example.

Other approaches may be used to form cell structures of clamp elements non-orthogonally as well. Thus, in accordance with one or more embodiments of the invention, FIGS. 9a-18c illustrate a process by which cell structures of clamp elements may be formed non-orthogonally. The process may, for instance, be used to form subtractive self-heating cell structures.

Figure 9C:
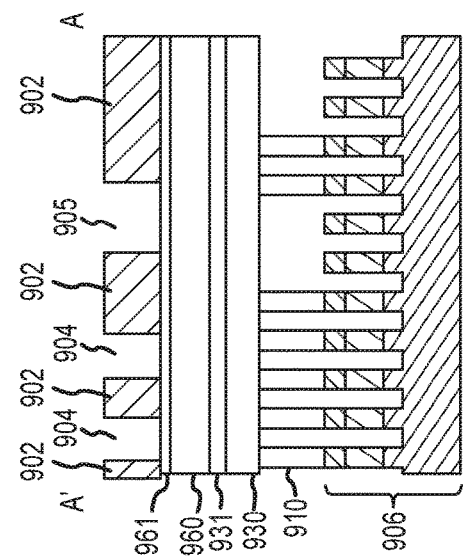
FIGS. 9b and 9c are side-view diagrams along two orthogonal directions of a structure according to an embodiment of the invention.
Figure 9A:
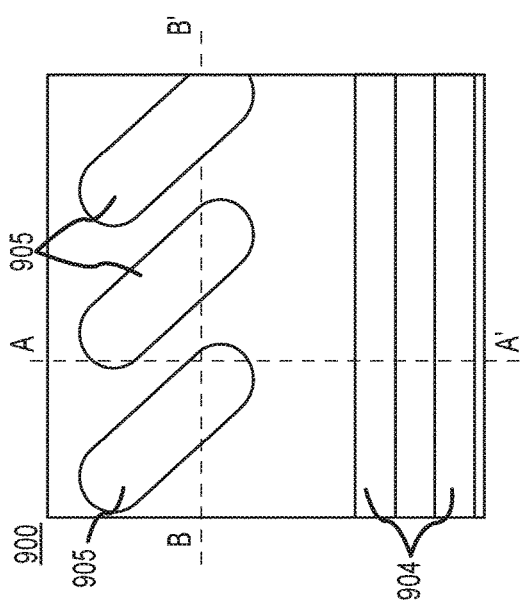
FIG. 9a is a plan-view diagram of a structure according to an embodiment of the invention.
Figure 9B:
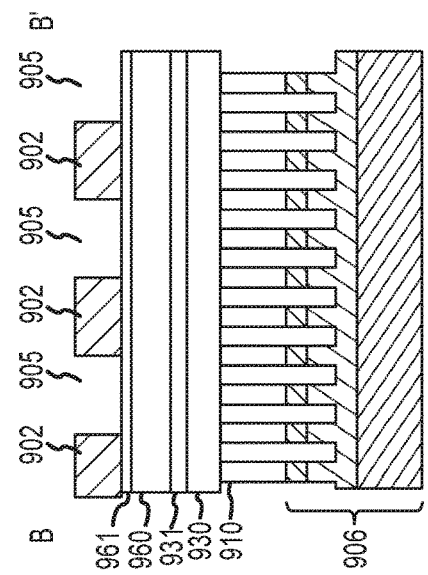

FIG. 9a is a plan-view diagram of a structure 900 according to an embodiment of the invention. FIGS. 9b and 9c are side-view diagrams along two orthogonal directions of the structure 900. FIGS. 9b and 9c may be cross-sectional views of the structure 900 taken along lines B-B' and A-A', respectively. The structure 900 may include a mask material 902 and mask holes 904, 905, and further may include chalcogenic material 930, bit line cap material 931, mask materials 960, 961, and contacts 910. Each of the mask materials 902, 960, 961 may comprise a nitride material and the mask holes 904, 905 may be formed in mask material 902. The chalcogenic material 930 may comprise any chalcogenic material, such as GST, and the bit line cap material 931 may comprise any conductive material, such as titanium nitride (TiN). With reference to FIGS. 9b and 9c, the mask holes 904, 905 may be formed in the mask material 902 over the mask material 961. The mask holes 904 may be formed over rows associated with cells and mask holes 905 may be formed over rows associated with clamp elements.

As illustrated in FIG. 9a, in at least one embodiment, the mask holes 904 may be substantially parallel to a row of contacts 910 and the mask holes 905 may be formed at a non-orthogonal angle (e.g., a 45-degree angle) relative to a row of contacts 910. Moreover, the mask holes 904 and the mask holes 905 may be formed with different pitches. The pitch may comprise, for instance, the width of a mask hole in a word line direction and the distance between the mask hole and an adjacent mask hole in a word line direction, or the pitch may comprise the width of a mask hole in a bit line direction and the distance between the mask hole and an adjacent mask hole in the bit line direction. In at least one embodiment, pitches for mask holes 305 may be determined in the word line direction and pitches for mask holes 304 may be determined in the bit line direction. By way of example, in at least one embodiment, the mask holes 905 may have 1.5× or 2× the pitch of the mask holes 904. It will be appreciated by those having ordinary skill in the art, however, that the mask holes 904 and/or the mask holes 905 may each have any desired pitch.

In some instances, the angle at which mask holes 905 are formed may vary. For example, the angle of the mask 905 may be determined based on the size and separation of the contacts 910 in one or more of the word line and hit line directions. In at least one embodiment, the mask holes 905 may be formed such that the sidewall of the mask hole is substantially aligned with the center of one or more contacts 910. Thus, the angle of a mask hole 905 may be based, at least in part, on the distance between centers of adjacent contacts 910 in a bit line direction and the distance between the center of adjacent contacts in a word line direction. More precisely, the angle may be based, at least in part, on the ratio of the two distances. In at least one embodiment, the angle may be equal to the arc tangent of the value equal to the distance between centers of adjacent contacts 910 in a bit line direction divided by the distance between the center of adjacent contacts in a word line direction. In some embodiments, the distance between centers of adjacent contacts 910 in a word line direction may differ (e.g., larger or smaller) from the distance between the center of adjacent contacts 910 in a bit line direction. In some embodiments, the distance between centers of adjacent contacts 910 for rows associated with cells may differ from the distance between centers of adjacent contacts 910 for rows associated with clamp elements. In this manner, distances may differ in a word line direction and/or in a bit line direction.

FIG. 10a is a plan-view diagram of a structure 1000 according to an embodiment of the invention. FIGS. 10b and 10c are side-view diagrams along two orthogonal directions of the structure 1000. FIGS. 10b and 10c may be cross-sectional views of the structure 1000 taken along lines B-B' and A-A', respectively. The structure 1000 may include at least a portion of the structure 900. As illustrated and with reference to FIGS. 10b and 10c, relative to the structure 900, portions of the mask material 902 may be removed such that the respective pitches of the mask holes 904, 905 are increased. Pitches of the mask holes 904, 905 may be increased by the same amount, or may be removed by varying amounts. In one embodiment, for example, the pitches of the mask holes 904, 905 may be increased such that the pitch of a mask hole 904 is increased by 50% and the pitch of a mask hole 905 is increased by 25%. Portions of the mask material 902 may be removed by any approach known in the art, now or in the future, including etching.

FIGS. 11a and 11b are side-view diagrams along two orthogonal directions of a structure 1100 according to an embodiment of the invention. The two orthogonal directions are shown along lines B-B' and A-A' in FIGS. 11a and 11b, respectively, which may also correspond to the lines B-B' and A-A' of the structure 1000 of FIG. 10a. The structure 1100 may include the structure 1000 and further may include a spacer material 932. The spacer material 932 may be formed over the mask material 902 and exposed portions of the mask material 961 in the mask holes 904, 905. The spacer material 932 may be formed, for instance, using any dielectric and/or nonconductive material (e.g., nitride) known in the art, now or in the future.

FIG. 12a is a plan-view diagram of a structure 1200 according to an embodiment of the invention. FIGS. 12b and 12c are side-view diagrams along two orthogonal directions of the structure 1200. FIGS. 12b and 12c may be cross-sectional views of the structure 1200 taken along lines B-B' and A-A', respectively. The structure 1200 may include at least a portion of the structure 1100. With reference to FIGS. 12b and 12c, relative to the structure 1100, a portion of the spacer material 932 may be removed such that remaining portions of the spacer material 932 line the sidewalls of the mask holes 904, 905, thereby forming a plurality of spacer elements 936.

FIG. 13a is a plan-view diagram of a structure 1300 according to an embodiment of the invention. FIGS. 13b and 13c are side-view diagrams along two orthogonal directions of the structure 1300. FIGS. 13b and 13c may be cross-sectional views of the structure 1300 taken along lines B-B' and A-A', respectively. The structure 1300 may include at least a portion of the structure 1200. As illustrated and with reference to FIGS. 13b and 13c, relative to the structure 1200, the mask material 902 may be removed, thereby further exposing the mask material 961.

Figure 14A:
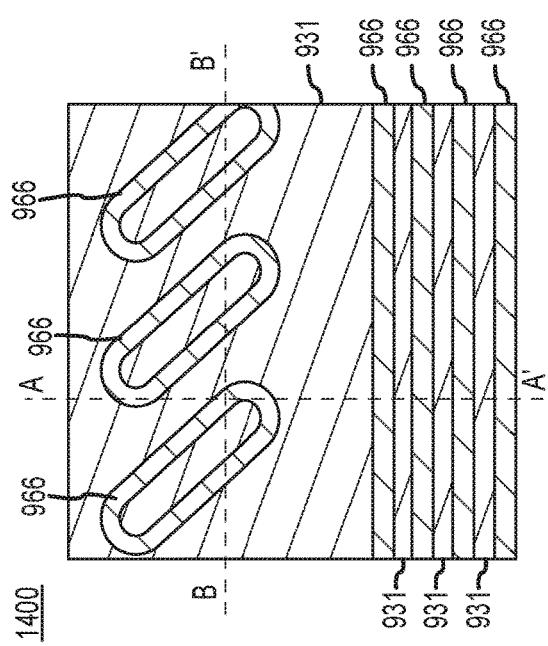
FIG. 14a is a plan-view diagram of a structure according to an embodiment of the invention.
Figure 14C:
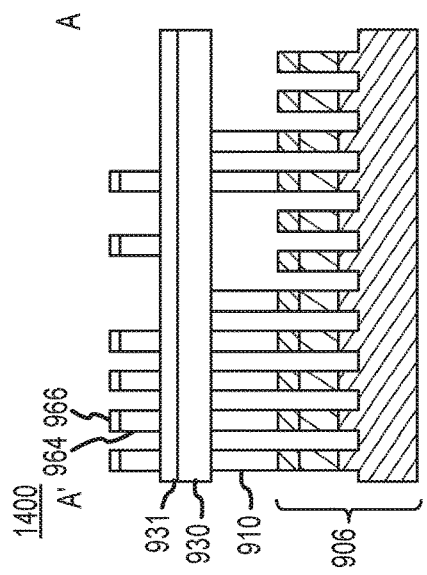
FIGS. 14b and 14c are side-view diagrams along two orthogonal directions of a structure according to an embodiment of the invention.
Figure 14B:
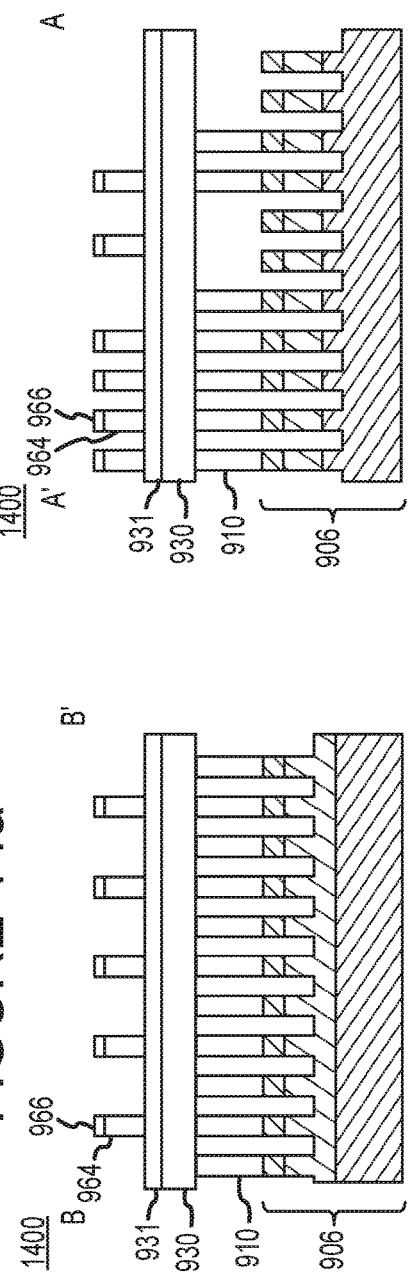

FIG. 14a is a plan-view diagram of a structure 1400 according to an embodiment of the invention. FIGS. 14b and 14c are side-view diagrams along two orthogonal directions of the structure 1400. FIGS. 14b and 14c may be cross-sectional views of the structure 1400 taken along lines B-B' and A-A', respectively. The structure 1400 may include at least a portion of the structure 1300. With reference to FIGS. 14b and 14c, relative to the structure 1300, the spacer elements 936 may be removed, as well as respective portions of the mask materials 960 and 961 exposed between the spacer elements 936. Removal of the spacer elements 936 and respective portions of the mask materials 960, 961 may be performed in any manner and may form a plurality of mask elements 964, 966 as shown.

FIG. 15a is a plan-view diagram of a structure 1500 according to an embodiment of the invention. FIGS. 15b and 15c are side-view diagrams along two orthogonal directions of the structure 1500. FIGS. 15b and 15c may be cross-sectional views of the structure 1500 taken along lines B-B' and A-A', respectively. The structure 1500 may include at least a portion of the structure 1400. With reference to FIGS. 15b and 15c, relative to the structure 1400, the plurality of mask elements 964, 966 may be removed, as well as respective portions of the chalcogenic material 930 and bit line cap material 931. Removal of a portion of the of the chalcogenic material 930 and bit line cap material 931 in this manner may form a plurality of chalcogenic material elements 934 and bit line caps 935, respectively. The chalcogenic material elements 934 may, for instance, correspond to the chalcogenic material elements 260 of FIG. 2c.

Figure 16B:
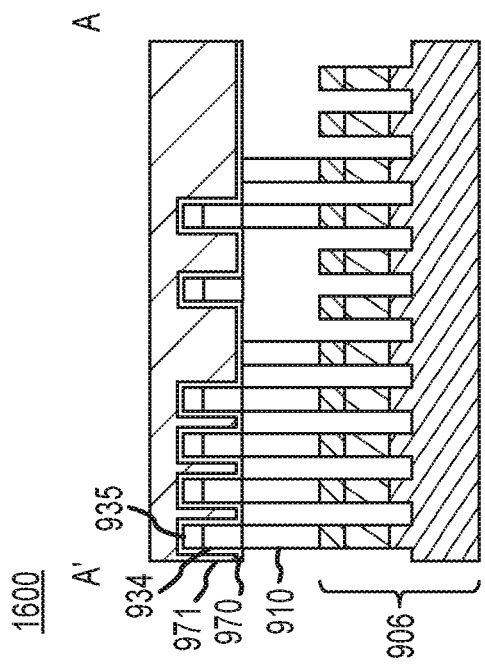
FIGS. 16a and 16b are side-view diagrams along two orthogonal directions of a structure according to an embodiment of the invention.
Figure 16A:
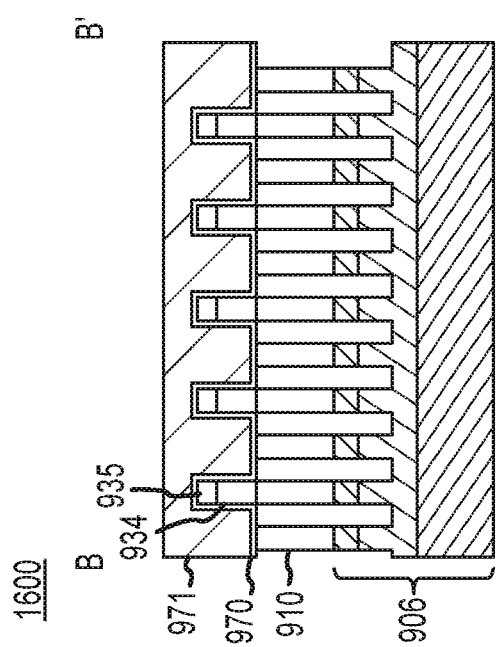

FIGS. 16a and 16b are side-view diagrams along two orthogonal directions of a structure 1600 according to an embodiment of the invention. The two orthogonal directions are shown along lines B-B' and A-A' in FIGS. 16a and 16b, respectively, which may also correspond to the lines B-B' and A-A' of the structure 1500 of FIG. 15a. The structure 1600 may include the structure 1500 and further may include a sealant material 970 and a filling material 971. The sealant material 970 may comprise any sealant (e.g., epoxy resin) and may be formed over the contacts 910 and the bit line cap 935. The sealant material may be configured to prevent and/or reduce diffusion currents within the structure 1600. The filling material 971 may comprise any dielectric material and may be formed over the sealant material 970. The filling material 971 may be configured to prevent cross-diffusion and/or to form a planar surface, as described with respect to FIGS. 17a and 17b.

Figure 17B:
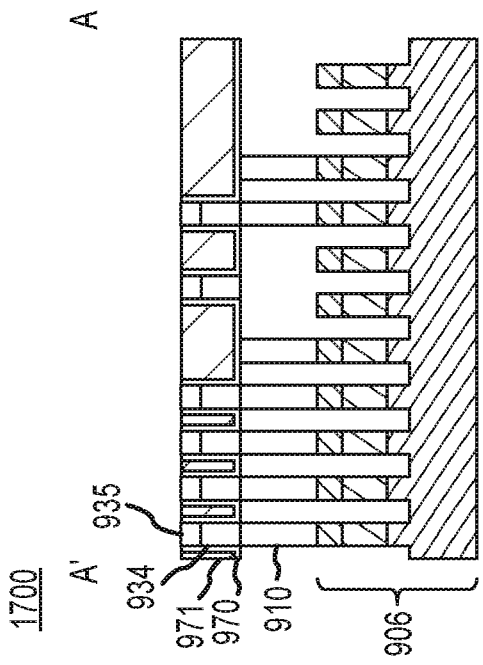
FIGS. 17a and 17b are side-view diagrams along two orthogonal directions of a structure according to an embodiment of the invention.
Figure 17A:
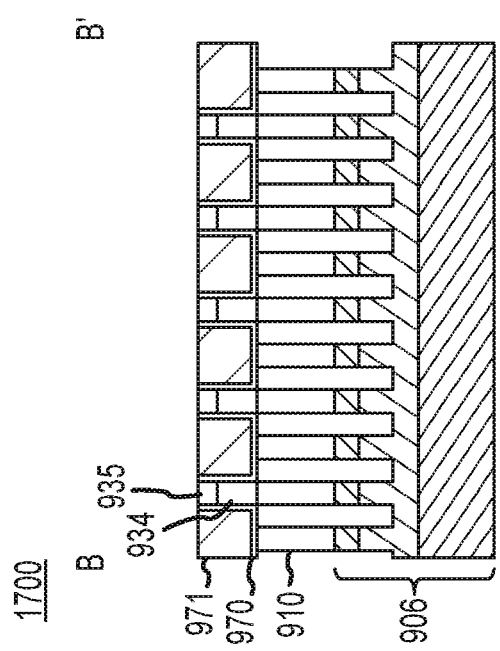

FIGS. 17a and 17b are side-view diagram along two orthogonal directions of a structure 1700 according to an embodiment of the invention. The two orthogonal directions are shown along lines B-B' and A-A' in FIGS. 17a and 17b, respectively, which may also correspond to the lines B-B' and A-A of the structure 1500 of FIG. 15a or the structure 1600 of FIGS. 16a and 16b. The structure 1700 may include at least a portion of the structure 1600. In at least one embodiment, relative to the structure 1600, portions of the sealant material 970 and filling material 971 may be removed such that bit line cap 935 are exposed and a planar surface is formed over the structure 1700. Forming a planar surface in this manner may, for instance, allow bit lines to be formed over a planar surface.

Subsequently, in at least one embodiment, bit lines 948 may be formed over the filling material 971 and exposed bit line caps 935 in the manner described with respect to FIGS. 6a and 7a. In other embodiments, bit lines 948 may be formed in any other manner known in the art.

FIG. 18a illustrates a structure 1800 according to an embodiment of the invention. FIGS. 18b and 18c are side-view diagrams along two orthogonal directions of the structure 1800. FIGS. 18b and 18c may be cross-sectional views of the structure 1800 taken along lines B-B' and A-A', respectively. With reference to FIGS. 18b and 18c, the bit line caps 935 and chalcogenic material elements 934 may be formed between respective contacts 910 and bit lines 948. In this manner, clamp elements including subtractive self-heating type cell structures may be formed non-orthogonally, for instance, relative to the word line direction and/or bit line direction.

Accordingly, a bit line 948, a bit line cap 935, a chalcogenic material element 934, a contact 910, and a switch 906 may for a cell structure, such as a cell structure 250 of FIG. 2c, be used as a clamp element 120 or a cell 110 of FIG. 1. With reference to FIG. 18a, in at least one embodiment, those cell structures formed non-orthogonally relative to one or more bit lines and/or one or more word lines may comprise clamp elements and those formed orthogonally may comprise cells.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming cell structures, comprising:
   forming a mask material having a mask hole, the mask hole formed non-orthogonally relative to a row of contacts;
   forming a conductive material and a spacer material over the mask material and in a portion of the mask hole;
   removing portions of the conductive material and the spacer material to expose contacts from the row of contacts underlying the mask hole and to form a plurality of conductive elements and a plurality of spacer elements; and
   forming a plurality of bit lines over the plurality of conductive elements and spacer elements.

2. The method of claim 1, further comprising:
   after removing portions of the conductive material and the spacer material, forming a chalcogenic material over the plurality of conductive elements and the plurality of spacer elements.

3. The method of claim 1, wherein said removing portions of the conductive material and the spacer material comprises:
   removing horizontal portions of the conductive material and the spacer material.

4. The method of claim 1, wherein the conductive material comprises a chalcogenic material.

5. The method of claim 1, wherein an angle at which the mask hole is formed is based, at least in part, on a distance between centers of contacts in a word line direction, centers of contacts in a bit line direction, or a combination thereof.

6. The method of claim 1, wherein the mask hole is formed at a 45 degree angle relative to the row of contacts.

7. The method of claim 1, wherein removing portions of the conductive material and the spacer material comprises removing horizontal portions of the conductive material and the spacer material in the mask hole to leave the conductive material and the spacer material along a wall of the mask hole.

8. A method comprising:
   forming a row of contacts;
   forming a mask material on the row of contacts, the mask material having a plurality of holes formed non-orthogonally relative to the row of contacts;
   forming a plurality of wall self-heating type cell structures in the holes over the row of contacts, wherein forming the plurality of wall self-heating type cell structures comprises:
      forming a chalcogenic material layer over contacts from the row of contacts and the mask material,
      forming spacer material layer over the chalcogenic material layer, the chalcogenic material layer and the spacer material layer are formed over the mask material and fill a portion of at least one of the plurality of holes, and
      removing first portions of the chalcogenic material layer and the spacer material layer to leave second portions of the chalcogenic material layer and the spacer material layer along walls of the plurality of holes formed in the mask material, and to expose the contacts from the row of contacts underlying the at least one of the plurality of holes; and
   forming a bit line over the plurality of wall self-heating type cell structures.

9. The method of claim 8, wherein the plurality of wall-self-heating type cell structures are formed non-orthogonally with the row of contacts.

\* \* \* \* \*